United States Patent

Miller

[15] 3,664,880

[45] May 23, 1972

[54] MECHANICAL MOUNTING FOR A THERMOELECTRIC COUPLE

[72] Inventor: Norman C. Miller, Woodland Hills, Calif.

[73] Assignee: North American Rockwell Corporation

[22] Filed: Apr. 14, 1969

[21] Appl. No.: 815,789

[52] U.S. Cl. ....................136/205, 136/230

[51] Int. Cl. ....................H01v 1/02

[58] Field of Search ....................136/230, 203–205, 136/211, 212; 62/3

*Primary Examiner*—Benjamin R. Padgett

*Assistant Examiner*—Harvey E. Behrend

*Attorney*—L. Lee Humphries

[57] ABSTRACT

An improved mechanical mounting that places the thermoelectric elements of a thermoelectric couple under compressive loading to ensure good electric and thermal contact.

6 Claims, 2 Drawing Figures

Patented May 23, 1972 3,664,880

INVENTOR.
NORMAN C. MILLER

BY Donald J. Ellingsberg

MECHANICAL MOUNTING FOR A THERMOELECTRIC COUPLE

The invention described herein was made in the performance of work under a NASA contract and is subject to the provisions of Section 305 of the National Aeronautics and Space Act of 1958, Public Law 85—568 (72 Stat. 435; 42 U.S.C. 2457).

BACKGROUND OF THE INVENTION

There is considerable interest in the use of thermoelectric devices for converting heat energy directly to electrical energy without the use of conventional rotating machinery. Thermoelectric materials are well known to the art and include such materials as germanium-silicon and lead-telluride. A thermoelectric couple customarily consists of the thermoelectric material, alternately doped with p-type and n-type dopants in the case of semi-conductors, with electrical contacts joined thereto. One side of the element is connected to a hot junction or wall which serves as a heat source, and the other side to a cold junction or wall such as a radiator which serves as a heat sink. The impressed temperature differential across the element generates an e.m.f. in accordance with the Seebeck effect.

Certain of the properties of semi-conductor materials are particularly attractive for use in thermoelectric converters. The semi-conductors generally have a relatively low thermal conductivity, which gives a high temperature differential between hot and cold junctions. The electrical resistivity can be low enough to permit high current flows with low potential. The materials are readily doped to form negative (n) and positive (p) materials. By arranging positive and negative elements in couples, and connecting the couples in series, the voltages can be increased to useful values in a thermoelectric power converter system formed thereby.

There are, however, certain undesirable properties of the semi-conductor materials. It is well known that the materials are very susceptible to rupture from mechanical and thermal shock, particularly during temperature cycling. It is, therefore, highly desirable that the couple be compressively loaded to maintain firm contact between the thermoelectric elements, the metallic hot and cold walls or shoes, and the heat source and heat sink, and further to provide structural support.

Brunings et al., in a copending application Ser. No. 752,705, filed Aug. 14, 1968, and since abandoned, assigned to the same assignee as the present invention, disclose a mechanical mounting for a thermoelectric couple that compressively loads a thermoelectric couple while structurally compensating for dimensional and alignment differences of the thermoelectric couple. The mechanical mounting has an unrestrained channel member that yields or rocks during assembly and couple operation while maintaining a predetermined compressive load on the thermoelectric elements of the couple.

Although good electrical and thermal contact is assured by the disclosed mechanical mounting, there are finite limits to the thermal growth that can be compensated for by the disclosed mechanical mounting while maintaining the desired compressive load. There are certain instances when unequal thermal growth of the thermoelectric elements develops edge loading of the elements rather than the desired uniformly distributed end loading. Edge loading can crack and crush the very fragile thermoelectric material, and can also separate the thermoelectric elements from the shoes, with an accompanying loss of electrical generating capability by the disclosed thermoelectric couple.

OBJECTS OF THE INVENTION

Accordingly, it is an object of the invention to provide a new and improved mechanical mounting for a thermoelectric couple.

It is an object of the invention to provide a mechanical mounting that structurally compensates for dimensional and alignment differences of a thermoelectric couple.

It is an object of the invention to provide a mechanical mounting that ensures good electrical and thermal contact during operation of a thermoelectric couple.

It is an object of the invention to provide a new and improved mechanical mounting that compressively loads a thermoelectric couple.

It is an object of the invention to provide a mechanical mounting that maintains a uniformly distributed compressive load on a thermoelectric couple.

It is an object of the invention to provide a mechanical mounting that minimizes thermal shunting of a thermoelectric couple.

It is an object of the invention to provide a mechanical mounting that minimizes spring assembly weight of a thermoelectric couple.

It is an object of the invention to provide a mechanical mounting that minimizes series thermal impedance of a thermoelectric couple.

SUMMARY OF THE INVENTION

Briefly, in accordance with one embodiment of the invention, a new and improved mechanical mounting for a thermoelectric couple is provided that places the thermoelectric elements under compressive loading which permits dimensional and alignment adjustments during couple operation by a fastener means, such as a stud, that connects spaced-apart compression means, such as plate or channel members, and is maintained in tension by a spring means that bears upon the stud and at least one of the channel members. The compression means transmits an equal but oppositely directed compressive force introduced by the stud and spring arrangement to the thermoelectric elements of the couple. One channel member is unrestrained which permits the channel member to yield or shift during assembly and couple operation while maintaining the predetermined, constant, and uniformly distributed compressive load on the elements.

While the specification concludes with claims particularly pointing out and distinctly claiming the subject matter which may be regarded as the invention, the organization and method of operation, together with further objects, features, and the attending advantages thereof, may best be understood when the following description is read in connection with the accompanying drawing.

DESCRIPTION OF THE INVENTION

Figure 1:
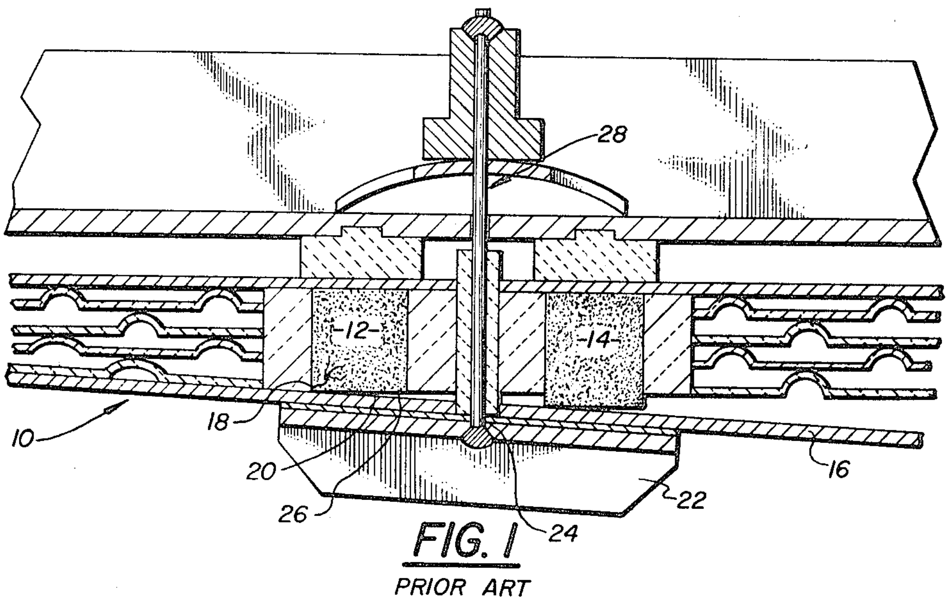
FIG. 1 PRIOR ART
FIG. 1 is a sectional view, partly broken away, of a PRIOR ART form of a mechanical mounting for a thermoelectric couple.

Referring to FIG. 1, a prior art form of mechanical mounting for a thermoelectric couple 10 can experience non-uniform compressive loading of cylindrical thermoelectric elements 12 and 14 during operation because of unequal thermal growth or other dimensional change of the thermoelectric elements; the thermal growth of thermoelectric element 14 as illustrated by FIG. 1 is exaggerated for clarity. This unequal thermal growth by thermoelectric element 14 causes a hot junction or wall 16 to bear against edge 18 of thermoelectric element 12 rather than uniformly across the end or face 20 of element 12. The increased length of thermoelectric element 14 thus rocks channel member 22 against the spring-loaded urging of a fastener stud 24 and causes the hot wall 16 to move or peel away from the face 20 of thermoelectric element 12 leaving a finite gap 26 as illustrated by FIG. 1. The hot wall 16 can also begin to peel away from the face of thermoelectric element 14 as illustrated. In this prior art form of mechanical mounting for a thermoelectric couple 10, the T-bar arrangement of the hot wall 16/channel member 22 and the stud 24 rotates as a unit about a singular pivot point generally indicated at 28.

Figure 2:
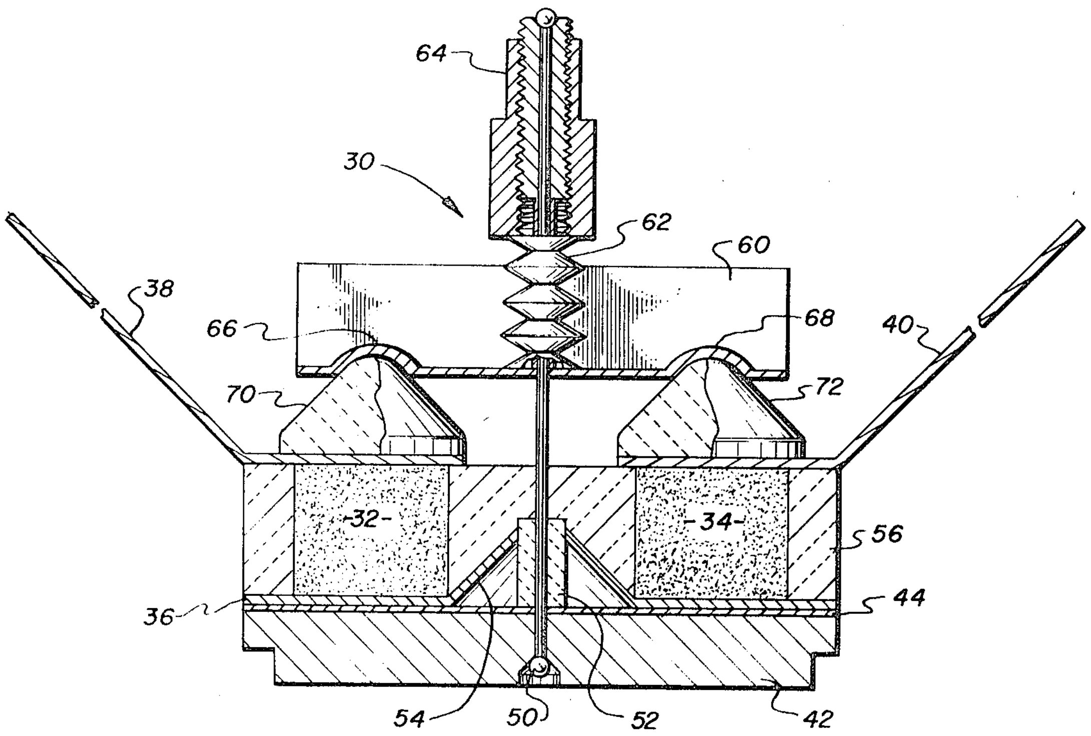
FIG. 2 is a sectional view, partly broken away, of the new and improved mechanical mounting for a thermoelectric couple in accordance with the invention.

Referring to FIG. 2, the improved mechanical mounting of the invention for a thermoelectric couple 30 has cylindrical thermoelectric elements 32 and 34, which are n-type and p-type respectively, that convert a portion of applied heat energy to electrical energy in a conventional manner. The thermoelectric elements 32 and 34 are metallurgically bonded to a hot junction or electrical conductor strap 36 that receives heat from a heat source as described hereinafter. Thermoelectric element 32 is metallurgically bonded to a cold junction such as radiator wall 38, and thermoelectric element 34 is bonded in a similar manner to a cold junction such as radiator wall 40. The resulting thermocouple 30, therefore, has a desired electrical path defined by the series-connected elements, i.e., radiator 38, element 32, hot junction 36, element 34 and radiator 40.

A rigid member such as wall member 42 positioned on the hot side of the couple 30 bears against the hot junction 36 and transfers heat received from a heat source (not shown but conventional) to the hot junction. It is contemplated that the rigid member can be a channel member. The wall member 42 is electrically insulated from yet thermally connected to the hot junction 36 by a suitable insulator member 44 such as an alumina layer, particularly where the hot junction strap 36 is formed from aluminum.

A fastener such as stud 50, which can be formed from a low creep material such as Rene-41, (54Ni—19Cr—11Co—10Mo—3Ti—1.5Al), passes through wall member 42 and through an electrical insulator member 52 which can be formed, for example, from alumina or quartz. The electrical insulator member 52 is positioned through the hot junction strap 36 generally at a convolute portion 54 that accomodates for thermal growth. The insulator member 52 extends into a suitably formed thermal insulator 56 that generally encloses the thermoelectric elements 32 and 34. The thermal insulator 56 minimizes undesirable heat shunt paths and thus constrains the heat energy to flow through the thermoelectric elements.

The stud 50 passes freely through a movable member such as channel member 60 and through a spring member 62 that bears upon the channel member. The spring member 62 can be a stack of conventional spring washers, suitably assembled as shown, which can be formed from stainless steel or other high-temperature alloys. A collar-spring retaining assembly 64 is adjustably connected to the end of the stud 50 and bears upon the spring stack 62. The adjustable retaining assembly 64 enables a predetermined compressive load to be placed upon the thermoelectric elements 32 and 34 as desired for efficient couple operation.

The desired compressive loading of the thermoelectric elements 32 and 34 results from the adjustable tension loading of the stud 50 by the spring 62 which bears upon the channel member 60. The adjustable retaining assembly 64 compresses the spring stack 62 against the channel member 60 to a slightly deformed position from a normal or relaxed stacked position. This tension loading of the stud 50 develops an equal and oppositely directed compressive load that is transmitted to the couple elements that are sandwiched between the spaced-apart wall member 42 and the channel member 60.

The movable or unrestrained channel member 60 has suitably formed depressions 66 and 68 that freely receive and bear upon complementary pressure pads or buttons 70 and 72, respectively. The buttons 70 and 72 can be formed into a generally conical shape as shown from a conventional ceramic that is an electrical insulator. The improved mechanical mounting of the invention positions these buttons 70 and 72 to bear upon radiators 38 and 40, respectively, and transmit the developed compressive load to the thermoelectric elements 32 and 34 through the two pivot points formed by the complementary mating surfaces of the channel depressions 66 and 68 and the respective buttons 70 and 72.

Since the unrestrained channel member 60 can yield under the compressive loading as described, any dimensional and alignment adjustments that are necessary during assembly and operation of the thermoelectric couple 30 are compensated by the yieldable channel member 60 as the channel member shifts about the two pivot points while the stud 50 generally maintains an undisturbed parallel relationship with the axes of the thermoelectric elements 32 and 34. The spring-loaded stud therefore maintains the continuous compressive load on the total end face of each of the thermoelectric elements 32 and 34 that form the couple 30 so that there is no undesirable edge loading of the elements or peeling of the hot junction strap 36 from the end faces.

As will be evidenced from the foregoing description, certain aspects of the invention are not limited to the particular details of construction as illustrated. It is contemplated that the wall member can be the wall portion of a duct means through which a heated fluid flows and along which a series of thermoelectric couples similar to the couple shown by FIG. 2 are spaced. It is further contemplated that a duct means could be connected to the radiator wall and a relatively cold fluid passed through the duct to improve the capacity of the cold junction to absorb heat. The duct means through which the cooled fluid flows could also replace the radiator wall, and thus would be positioned between a thermoelectric element end face and a pressure button. It is contemplated that other modifications and applications will occur to those skilled in the art. It is, therefore, intended that the appended claims shall cover such modifications and applications that do not depart from the true spirit and scope of the invention.

I claim:

1. An improved mechanical mounting for a thermoelectric device comprising:

a. thermoelectric means for converting heat energy to electrical energy, said thermoelectric means comprising at least first and second spaced-apart thermoelectric elements having substantially parallel longitudinal axes;

b. heat rejection means individually associated with respective ones of said elements, each said means comprising a metal sheet having first and second opposed planar surfaces, the first planar surface being in direct contact with its respective thermoelectric element at corresponding ends of said longitudinal axes;

c. individual pressure-transmitting button means adjacent to respective ones of said elements, each said button means having a first surface resting upon and in planar contact with the second planar surface of the associated heat rejection means and having a coniform surface directed away from said elements;

d. unitary pressure-transmitting means including a continuous surface having at least first and second depressions therein individually contacting and pivotably receiving the second coniform surface of associated ones of the individual button means;

e. single spring means to exert pressure on said unitary pressure-transmitting means in the direction of said button means to provide pivotal contact therebetween; and f. pressure-maintaining means to maintain said spring means in compression;

g. said single spring means being separate from and structurally independent of said heat rejection means, disposed intermediate and in contact with said pressure-maintaining means and said unitary pressure-transmitting means, and associated with at least both said first and second thermoelectric elements.

2. The improved mechanical mounting of claim 1 which further includes a stud having its longitudinal axis substantially parallel to that of the thermoelectric elements and connected at one end thereof to the pressure-maintaining means and connected at its other end to a structural member insulated from the thermoelectric elements, said stud passing through said spring means and said pressure-transmitting means to thereby position these means with respect to the thermoelectric elements.

3. The improved mechanical mounting of claim 2 wherein said pressure-maintaining means comprises an adjustable retaining collar.

4. The improved mechanical mounting of claim 1 wherein each of said button means electrically insulates said unitary pressure-transmitting means from said thermoelectric elements.

5. The improved mechanical mounting of claim 1 wherein a conductor member is electrically and thermally connected to said first and second thermoelectric elements and is spaced-apart from the heat rejection means individually associated with said first and second thermoelectric elements by said thermoelectric elements, said conductor member being convoluted so that dimensional and alignment adjustments of said thermoelectric means that are generally perpendicular to said axes are compensated during assembly and operation of the thermoelectric device.

6. The improved mechanical mounting of claim 1 wherein said spring means is a stacked assembly of stainless steel spring washers.

* * * * *